United States Patent [19]

Brown et al.

[11] Patent Number: 4,940,651
[45] Date of Patent: Jul. 10, 1990

[54] METHOD FOR PATTERNING CATIONIC CURABLE PHOTORESIST

[75] Inventors: Lawrence M. Brown, Endwell, N.Y.; Jeffrey D. Gelorme, Plainville, Conn.; Joseph P. Kuczynski, Apalachin; William H. Lawrence, Greene, both of N.Y.

[73] Assignee: International Business Machines Corporation, Armonk, N.Y.

[21] Appl. No.: 292,173

[22] Filed: Dec. 30, 1988

[51] Int. Cl.$^5$ .................................................. G03C 5/00
[52] U.S. Cl. .................................... 430/325; 430/280; 430/945
[58] Field of Search ................ 430/296, 280, 325, 945

[56] References Cited

U.S. PATENT DOCUMENTS

| | | | |
|---|---|---|---|
| 4,058,401 | 11/1977 | Crivello | 430/280 |
| 4,081,276 | 3/1978 | Crivello | 430/280 |
| 4,224,369 | 9/1980 | Borden et al. | 428/203 |
| 4,256,828 | 3/1981 | Smith | 430/280 |
| 4,442,197 | 4/1984 | Crivello | 430/280 |
| 4,508,749 | 4/1985 | Brannon et al. | 427/43.1 |
| 4,592,975 | 6/1986 | Young et al. | 430/5 |
| 4,610,947 | 9/1986 | Ahne | 430/296 |
| 4,619,894 | 10/1986 | Bozler et al. | 430/942 |
| 4,632,898 | 12/1986 | Fister et al. | 430/313 |
| 4,684,671 | 8/1987 | Tsuchiya et al. | 430/280 |
| 4,708,925 | 11/1987 | Newman | 430/280 |
| 4,839,261 | 6/1989 | Nakazaki et al. | 430/280 |

*Primary Examiner*—Jack P. Brammer
*Attorney, Agent, or Firm*—Pollock, Vande Sande & Priddy

[57] ABSTRACT

Cationic curable photoresists are patterned by exposing such to a laser beam in a pattern, followed by developing.

14 Claims, No Drawings

METHOD FOR PATTERNING CATIONIC CURABLE PHOTORESIST

DESCRIPTION

1. Technical Field

The present invention is concerned with patterning cationic curable photoresists. In particular, the present invention is concerned with patterning cationic curable photoresists by imagewise exposing such to a laser beam. The process of the present invention is especially advantageous in the fabrication of printed circuit boards and cards.

2. Background Art

One widely used method for forming a pattern on an epoxy laminate or inorganic substrate such as metallic circuitry in the manufacture of printed circuit boards in integrated circuits is to imagewise form a pattern of photoresist material over those areas of the substrate or over a metal coated substrate to be shielded from metal deposition or metal removal. The photoresist layer is normally formed of a polymeric, organic material that is substantially unaffected by the metal deposition of metal removal process and, accordingly, protects the underlying areas of the substrate. Numerous photoresists for such are well-known and are capable of forming the desired masking pattern on the desired substrate.

The pattern is formed by imagewise exposing the photoresist material to actinic light through a photographic image such as a glass master by photolithographic techniques. The actinic light employed is usually X-ray, U.V. radiation, or electron beam radiation.

In more recent years, laser direct imaging to form circuit patterns has been suggested. Laser direct imaging is especially attractive because of the increase in complexity of more layers and finer lines of integrated circuits. Laser direct imaging involves directly forming the desired pattern on the layer of photoresist material without the use of a glass master. The film art work is eliminated. The process involves CAD output digital data, converted into master scan image data, to direct a scanning laser beam onto the photoresist. For example, See G. Chen, "Recent Advances in Laser Direct Imaging for PWBs", *PC FAB*, Jan. 1986, p. 41, and Ford, et al., "Update on Laser Direct Imaging", *Circuits Manufacturing*, Mar. 1987, p. 32.

One of the problems encountered by laser direct imaging is finding resist materials suitable for implementing the laser direct imaging technique. For instance, the resists suggested have been based upon free radical polymerization. See R. R. Sadhir, J. D. B. Smith, and P. M. Castle, "Polymer Preprints", 26, 130 (1985); C. Decker, *J. Polym. Sci., Polym. Chem. Ed.*, 21, 2451 (1983); C. Decker, *J. Coatings Tech.*, 56, 29 (1984); and Williamson, et al., "Laser Initiated Polymerization of Charge-Transfer Monomer Systems", pp. 207-208. One problem associated with free radical polymerization is that oxygen inhibits the polymerization reaction. Therefore, to overcome the effect of oxygen on free radical polymerizations, it has been suggested to place a transparent oxygen barrier sheet such as polyethyleneterephthate (e.g., Mylar®) over the resist. However, this is not entirely satisfactory since exposure through the film invariably degrades the image resolution due to scattering.

SUMMARY OF THE INVENTION

The present invention is concerned with a laser imaging process that does not require employing an oxygen barrier sheet and which does not depend upon free radical polymerization mechanism. The present invention, therefore, does not suffer from the deficiencies obtained by using oxygen barrier sheets required by free radical polymerization. The present invention permits direct exposure of the resist without a glass master and without an oxygen barrier cover sheet. In addition, the process of the present invention makes it possible to achieve higher intensities at the resist surface, resulting in faster photosensitive films with improved resolution. The higher intensities permit deeper through cure and faster photospeeds.

It has been found pursuant to the present invention that cationic curable photoresists can be patterned by imagewise exposure to a laser beam and preferably to an argon laser beam. In particular, the present invention is concerned with a method for forming a pattern of a photoresist by providing on a substrate an uncured film of cationic curable photoresist, imagewise exposing the photoresist film to a laser beam in a pattern to thereby cure portions of the photoresist by cationic polymerization, and developing the photoresist.

BEST AND VARIOUS MODES FOR CARRYING OUT THE INVENTION

The resist materials employed according to the present invention must be curable or polymerizable by a cationic polymerization mechanism and include epoxy monomers, phenoplast, aminoplast, lactones, cyclic ethers, cyclic formals, and cyclic acetals, and preferably epoxy polymers.

Typical examples of epoxy polymers include the epoxidized novolak polymers and the polyepoxides from halo-epoxy alkanes such as epichlorohydrin and a polynuclear dihydric phenol such as bisphenol A. Mixtures of epoxides can be used when desired.

The epoxidized novolak polymers are commercially available and can be prepared by known methods by the reaction of a thermoplastic phenolic aldehyde of a phenol with a halo-epoxy alkane. The phenol can be a mononuclear or polynuclear phenol. Examples of mononuclear phenols have the formula:

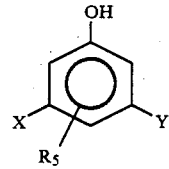

wherein X, Y, and $R_5$ are hydrocarbons containing no more than about 12 carbon atoms.

Hydrocarbon-substituted phenols having two available psotions ortho or para to a phenolic hydroxy group for aldehyde condensation to provide polymers suitable for the preparation of epoxy novolaks include o- and p-cresols, o- and p-ethyl phenols, o- and p-isopropyl phenols, o- and p-tert-butyl phenols, o- and p-secbutyl phenols, o- and p-amyl phenols, o- and p-octyl phenols, o- and p-nonyl phenols, 2,5-xylenol, 3,4-xylenol, 2,5-diethyl phenol, 3,4-diethyl xylenol, 2,5-diisopropyl phenol, 4-methyl resorcinol, 4-ethyl resorcinol, 4-isopropyl resorcinol, 4-tert-butyl resorcinol, o- and p-benzyl phenol, o- and p-phenethyl phenols, o- and p-phenyl phenols, o- and p-tolyl phenols, o- and p-xylyl phenols, o- and p-cyclohexyl phenols, o- and p-cyclopentyl phenols, 4-phenethyl resorcinol, 4-tolyl resorcinol, and 4-cyclohexyl resorcinol.

Various chloro-substituted phenols which can also be used in the preparation of phenol-aldehyde resins suitable for the preparation of the epoxy novolaks include o- and p-chloro-phenols, 2,5, -dichloro-phenol, 2,3-dichloro-phenol, 3,4-dichloro-phenol, 2-chloro-3-methyl-phenol 2-chloro-5-methyl-phenol, 3-chloro-2-methyl-phenol, 5-chloro-2-methyl-phenol, 3-chloro-4-methyl-phenol, 4-chloro-3-methyl-phenol, 4-chloro-3-ethyl-phenol, 4-chloro-3-isopropyl-phenol, 3-chloro-4-phenyl-phenol, 3-chloro-4-chloro-phenyl-phenol, 3,5di-chloro-4-methyl-phenol, 3,5-dichloro-5-methyl-phenol, 3,5-dichloro-2-methyl-phenol, 2,3-dichloro-5-methyl-phenol, 2,5-dichloro-3-methyl-phenol, 3-chloro-4,5-dimethyl-phenol, 4-chloro-3,4-dimethyl-phenol, 2-chloro-3,5-dimethyl-phenol, 5-chloro-2,3-dimethyl-phenol, 5-chloro-3,5-dimethyl-phenol, 2,3,5-trichloro-phenol, 3,4,5-trichloro-phenol, 4-chloro-resorcinol, 4,5-dichloro-resorcinol, 4-chloro-5-methyl-resorcinol, 5-chloro-4-methyl-resorcinol.

Typical phenols which have more than two positions ortho or para to a phenolic hydroxy group available for aldehyde condensation and which, by controlled aldehyde condensation, can also be used are: pheno, m-cresol, 3,5-xylenol, m-ethyl and m-isopropyl phenols, m,m'-diethyl and diisopropyl phenols, m-butyl-phenols, m-amyl phenols, m-octyl phenols, m-nonyl phenols, resorcinol, 5-methyl-resorcinol, 5-resorcinol.

Examples of polynuclear dihydric phenols are those having the formula:

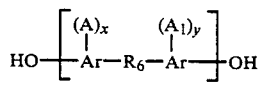

wherein Ar is an aromatic divalent hydrocarbon such as naphthylene and, preferably, phenylene; A and $A_1$ which can be the same or different are alkyl radicals, preferably having from 1 to 4 carbon atoms, halogen atoms, i.e., fluorine, chlorine, bromine, and iodine, or alkoxy radicals, preferably having from 1 to 4 carbon atoms; x and y are integers having a value 0 to a maximum value corresponding to the number of hydrogen atoms on the aromatic radical (Ar) which can be replaced by substituents and $R_6$ is a bond between adjacent carbon atoms as in dihydroxydiphenyl or is a divalent radical including, for example:

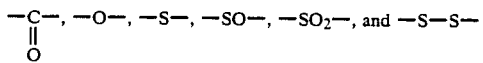

and divalent hydrocarbon radicals, such as alkylene, alkylidene, cycloaliphatic, e.g., cycloalkylene and cycloalkylidene, halogenated, alkoxy or aryloxy substituted alkylene, alkylidene and cycloaliphatic radicals, as well as alkarylene and aromatic radicals including halogenated, alkyl, alkoxy or aryloxy substituted aromatic radicals and a ring fused to an Ar group; or $R^1$ can be polyalkoxy, or polysiloxy, or two or more alkylidene radicals separated by an aromatic ring, a tertiary amino group, an ether linkage, a carbonyl group or a sulfur containing group such as sulfoxide, and the like.

Examples of specific dihydric polynuclear phenols include, among others, the bis-(hydroxyphenyl)alkanes such as 2,2'-bis-(4-hydroxyphenyl)propane, 2,4'-dihydroxydiphenylmethane, bis-(2-hydroxyphenyl)methane, bis-(4-hydroxyphenyl)methane, bis(4-hydroxy-2,6-dimethyl-3-methoxyphenyl)methane, 1,1'-bis-(4-hydroxyphenyl)ethane, 1,2'-bis-(4-hydroxyphenyl)ethane, 1,1'-bis-(4-hydroxy-2-chlorphenyl)ethane, 1,1'-bis(3-methyl-4-hydroxyphenyl)ethane, 1,3'-bis-(3-methyl-4-hydroxyphenyl)propane, 2,2'-bis-(3-phenyl-4-hydroxyphenyl)propane, 2,2'-bis-(3-isopropyl-4-hydroxyphenyl)propane, 2,2'-bis(2-isopropyl-4-hydroxyphenyl)pentane, 2,2'-bis-(4-hydroxyphenyl)heptane, bis-(4-hydroxyphenyl)phenylmethane, bis-(4-hydroxyphenyl)cyclohexylmethane, 1,2'-bis-(4-hydroxyphenyl)-1,2'-bis-(phenyl)propane and 2,2'-bis-(4-hydroxyphenyl)-1-phenyl-propane; di(hydroxyphenyl)-sulfones such as bis-(4-hydroxyphenyl)sulfone, 2,4'-dihydroxydiphenylsulfone, 5'-chloro-2,4'-dihydroxydiphenyl sulfone, and 5'-chloro-4,4'-dihydroxydiphenyl sulfone; di(hydroxyphenyl)ethers such as bis-(4-hydroxyphenyl)ether, the 4,4'-, 4,2'-, 2,2'-, 2,3'-, dihydroxydiphenyl ethers, 4,4'-dihydroxy-2,6-dimethyldiphenyl ether, bis-(4-hydroxy-3-isobutylphenyl)ether, bis-(4-hydroxy-3-isopropylphenyl)ether, bis-(4-hydroxy-3-chlorophenyl)ether, bis-(4-hydroxy-3-fluorophenyl)ether, bis-(4-hydroxy-3-bromophenyl)ether, bis-(4-hydroxynaphthyl)ether, bis-(4-hydroxy-3-chloronaphthyl)ether, bis-(2-hydroxydiphenyl)ether, 4,4'-dihydroxy-2,6-dimethoxydiphenyl ether, and 4,4'-dihydroxy-2,5-diethoxydiphenyl ether.

The preferred dihydric polynuclear phenols are represented by the formula:

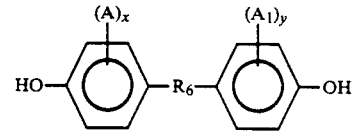

wherein A and $A_1$ are as previously defined, x and y have values from 0 to 4 inclusive and $R_6$ is a divalent saturated aliphatic hydrocarbon radical, particularly alkylene and alkylidene radicals having from 1 to 3 carbon atoms, and cycloalkylene radicals having up to and including 10 carbon atoms. The most preferred dihydric phenol is bisphenol A, i.e., 2,2'-bis(p-hydroxyphenyl)propane.

As condensing agents, any aldehyde may be used which will condense with the particular phenol being used, including formaldehyde, acetaldehyde, propionaldehyde, butyraldehyde, heptaldehyde, cyclohexanone, methyl cyclohexanone, cyclopentanone, benzaldehyde, and nuclear alkyl-substituted benzaldehydes, such as toluic aldehyde, naphthaldehyde, furfuraldehyde, glyoxal, acrolein, or compounds capable of engendering aldehydes such as para-formaldehyde, hexamethylene tetramine. The aldehydes can also be used in the form of a solution, such as the commercially available formalin. The preferred aldehyde is formaldehyde.

The halo-epoxy alkane can be represented by the formula:

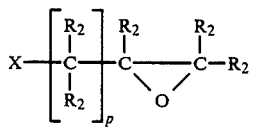

wherein X is a halogen atom (e.g., chlorine, bromine, and the like), p is an integer from 1-8, each $R_2$ individually is hydrogen or alkyl group of up to 7 carbon atoms; wherein the number of carbon atoms in any epoxy alkyl group totals no more than 10 carbon atoms.

While glycidyl ethers, such as derived from epichlorohydrin, are particularly preferred in the practice of this invention, the epoxy polymers containing epoxyalkoxy groups of a greater number of carbon atoms are also suitable. These are prepared by substituting for epichlorohydrin such representative corresponding chlorides or bromides of monohydroxy epoxyalkanes as 1-chloro-2,3-epoxybutane, 1-chloro-3,4-epoxybutane, 2-chloro-3,4-epoxybutane, 1-chloro-2-methyl-2,3-epoxy-propane, 1-bromo-2,3-epoxypentane, 2-chloromethyl-1,2-epoxybutane, 1-bromo-4-methyl-3,4-epoxypentane, 1-bromo-4-ethyl-2,3-epoxypentane, 4-chloro-2-methyl-2,3-epoxypentane, 1-chloro-2,3-epoxyoctane, 1-chloro-2-methyl-2,3-epoxyoctane, or 1-chloro-2,3-epoxydecane. Although it is possible to use haloepoxyalkanes having a greater number of carbon atoms than indicated above, there is generally no advantage in using those having a total of more than 10 carbon atoms.

The preferred epoxidized novolak employed in the present invention is represented by the average formula:

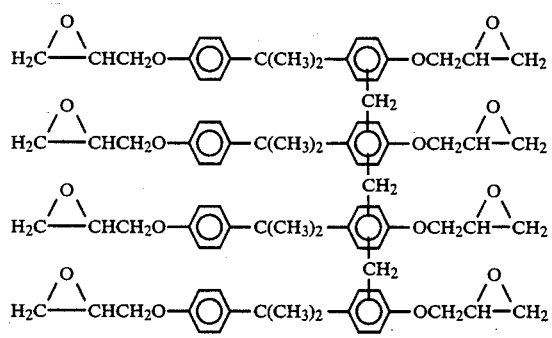

Such is commercially available under the trade designations EPI-REZ SU8® and INTEREZ CMD 2510®.

In addition, the polyepoxides of halo epoxy alkane of the type discussed above and a polynuclear dihydric phenol of the type above can be employed. The preferred polyepoxides of this class being the polyepoxides of epichlorohydrin and bisphenol A, i.e., 2,2-bis(p-hydroxyphenyl)propane.

The photoesist compositions also usually include a photoinitiator and generally in amounts of about 0.1% to about 10% and preferably about 0.5% to about 5% by weight. Suitable photoinitiators are well-known and include onium salts and especially Group VIA and Group VIIA salts such as the pyrylium, selenonium, sulfonium, and iodonium salts. Various suitable photoinitiators are discussed in U.S. Pat. Nos. 4,161,478; 4,442,197; 4,139,655; 4,400,541; 4,197,174; 4,173,476; and 4,299,938 and European patent applications 84/0094914 and 84/0126712, disclosures of which are incorporated herein by reference.

Also see Watt, et al., "A Novel Photoinitiator of Cationic Polymerization: Preparation and Characterization of Bis[4-(diphenylsulfonio)phenyl]-sulfide-Bis-Hexafluorophosphate", *Journal of Polymer Science: Polymer Chemistry Edition*, Vol. 22, p. 1789, 1980 John Wiley & Sons, Inc.

Additional discussions concerning sulfonium and iodonium salts can be found, for instance, in Pappas, et al., "Photoinitiation of Cationic Polymerization. III. Photosensitization of Diphenyliodonium and Triphenylsulfonium Salts", *Journal of Polymer Science: Polymer Chemistry Edition*, Vol. 22, pp. 77–84, 1984 John Wiley & Sons, Inc.; Crivello, et al., "Photoinitiated Cationic Polymerization with Triarylsulfonium Salts", *Journal of Polymer Science: Polymer Chemistry Edition*, Vol. 17, pp. 977–999, 1979 John Wiley & Sons, Inc.; Crivello, et al., "Complex Triarylsulfonium Salt Photoinitiators. I. The Identification, Characterization, and Syntheses of a New Class of Triarylsulfonium Salt Photoinitiators", *Journal of Polymer Science: Polymer Chemistry Edition*, Vol. 18, pp. 2677–2695, 1980 John Wiley & Sons, Inc.; and Crivello, "Cationic Polymerization—Iodonium and Sulfonium Salt Photoinitiators", *Advances in Polymer Science*, Series #62, pp. 1–48.

Examples of some sulfonium salts are arylocyldialkyl and hydroxy aryladialkyl sulfonium salts, represented by the following formulae:

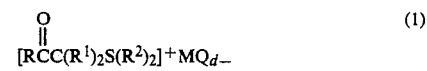

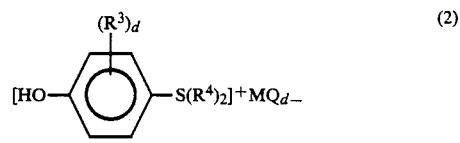

where R is a $C_{(6-13)}$ monovalent aromatic organic radicals or substituted $C_{(6-13)}$ monovalent aromatic organic radicals, $R^1$ is a monovalent radical selected from hydrogen, $C_{(1-8)}$ alkyl and mixtures thereof, $R^2$ is a $C_{(1-13)}$ monovalent organic radical, $R^3$ is a monovalent radical selected from $C_{(1-8)}$ alkyl hydroxy, $C_{(1-8)}$ alkoxy, halo and nitro, $R^4$ is a $C_{(1-8)}$ alkyl radical, M is a metal or metalloid, Q is halogen, and d is equal to 4–6.

Examples of arylacyldialkyl sulfonium salts are:

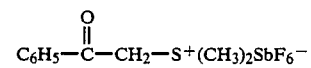

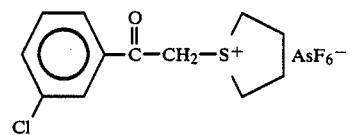

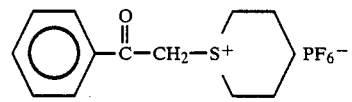

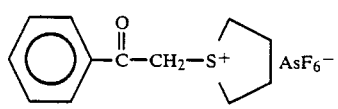
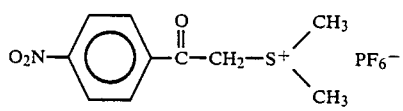
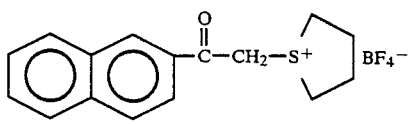
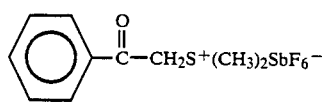
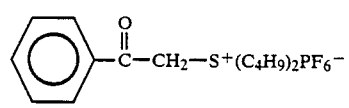
Examples of some hydroxyaryl dialkyl sulfonium salts are:
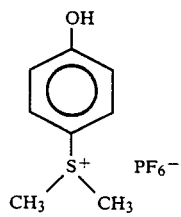 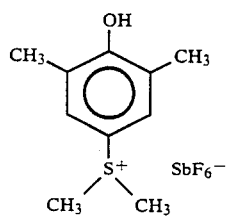
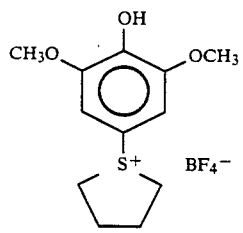
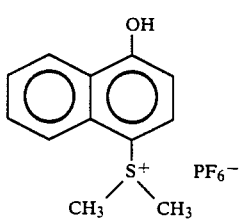
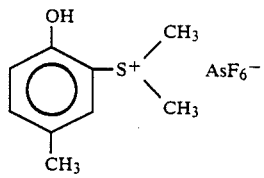
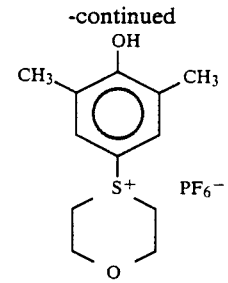
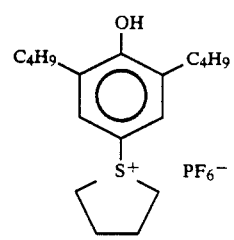
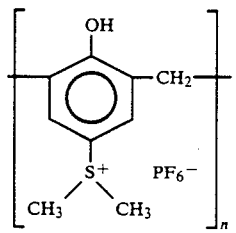
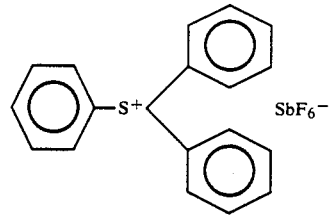
Other suitable photoinitiators are:
and
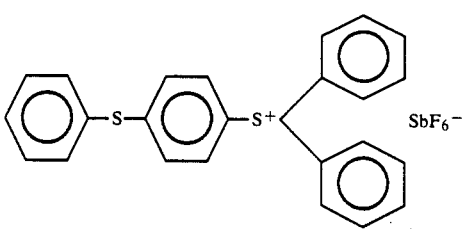
The photosensitive composition can be appled as a dry film or as a liquid composition employing volatile diluents.

Preferred compositions of the present invention contain:
(A) about 69% to about 79% by weight and preferably about 74% by weight of INTEREZ CMD 2510 ® (an octa-functional bisphenol A epoxy);
(B) about 15% to about 17% by weight and preferably about 16% by weight of a difunctional cycloaliphatic epoxy, Araldite CY-179 ®

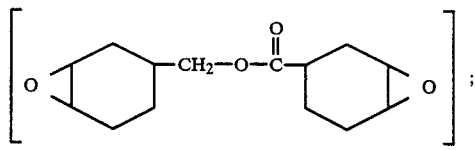

(C) about 4% to about 6% by weight and preferably about 5% by weight of a trifunctional epoxy Tactix 742 ®

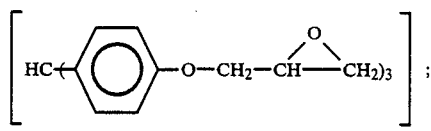

The process of the present invention includes providing on the desired substrate, such as a ceramic substrate, a layer of the cationic polymerizable composition and then subjecting the composition to imagewise exposure by a laser beam. Examples of suitable lasers are pulsed dye lasers, frequency doubled YAG lasers, nitrogen lasers and preferably argon lasers. The argon ion system is the most powerful of the above lasers and operates in a continuous mode with sufficient output to expose the photoresist.

For instance, the desired image is produced by rastering the argon laser beam over the substrate coated with the photosensitive composition. The 336-363 nanometer output from the argon laser beam is passed into a Newport Optics Acusto-Optic modulator which serves to effectively turn the laser on or off by redirecting the laser beam.

Typical argon laser systems are available under the trade designation Excellon Direct Imaging System 2000B ® from Excellon Corporation and Gerber LDI-1500 System ® from Gerber Scientific Instrument Corporation.

From there the laser is reflected onto a rotating polyhedron which directs the output onto a vacuum platen which holds the substrate. The polyhedron rasters the laser in the y direction while the table moves in the x direction—both motions are correlated. A computer determines when the pockels' cell is switched open, as well as how fast to rotate the polyhedron and move the table.

Typical operating conditions for the argon laser are as follows:

| | |
|---|---|
| Operating Wavelengths: | 365, 351, and 333 nanometers |
| Operating Laser Power: | 2.5 watts |
| Optical Throughput: | 45% |
| Expose energy over the entire platen: | 100 millijoule/cm$^2$ |
| Beam scanning speed: | 1600 inches/second |
| Beam diameter: | 0.001 inch (at 1/e of the laser beam profile) |
| Unit exposure time: | 6.25 × 10 exp-7 sec/pixel |
| Unit exposure energy: | 7.8 × 10 exp-2 millijoule/pixel |
| Unit exposure power: | 125 watts/pixel |
| Imaging table speed: | 125 watts/pixel, 4 inches/minute |

The argon ion laser, when operated in the UV mode, now exhibits good stability.

Cationically polymerizable formulations of the present invention possess excellent properties for use as solder masks or permanent dielectric layers.

After the imagewise exposure to the laser, the unexposed portion of the cationically polymerizable photoresist can be removed or developed by contact with a suitable solvent. For example, in the case of the polyepoxides, gamma-butyrolactone, propylene carbonate, diglyme, or mixtures of any of the foregoing, as well as binary blends of either propylene carbonate or gamma-butyrolactone with 1,1,1-trichloroethane are suitable.

The following non-limiting examples are presented to further illustrate the present invention:

EXAMPLE

Onto an epoxy-gloss laminate is laminated a cationically polymerizable film containing about 74% by weight of Interez CMD 2510 ® (an octa-functional bisphenol A epoxy); about 16% by weight of Araddite CY-179 ®; about 5% by weight of Tactix 742 ®; about 4.9% GEUVE 1014 ® photoinitiator; and about 0.1% FLOURAD FC430 ® fluorinated surfactant. The film is about 2 mils thicks. The film is imagewise exposed to an argon laser employing a wavelength of about 351 nanometers using an Excellon Direct Imaging System 2000B ® at a power of about 2.5 watts. The exposure energy over the entire platen is about 100 millijoules/cm$^2$ and the beam scanning speed is about 1600 inches/second.

The laser imaging provides excellent resolution and, in particular, 1 mil lines and spaces are resolved in the 2 mil thick film. The unexposed portions of the epoxy are developed in 10 weight percent gamma-butyrolactone resulting in a high contrast, highly resolved pattern.

Having thus described our invention, what we claim as new and desire to secure by Letters Patent is:

1. A method for patterning a photoresist which comprises:
   a. providing on a substrate an uncured film consisting essentially of a cationic curable photoresist and an onium slat photoinitiator;
   b. imagewise exposing said photoresist to a laser beam operated at wavelengths of about 333 nanometers to about 365 nanometers in a pattern to thereby cure portions of said photoresist by cationic polymerization; and
   c. developing said photoresist by contacting with a solvent to thereby remove the portions of the photoresist not exposed to said laser beam.

2. The method of claim 1 wherein laser is an argon ion laser.

3. The method of claim 1 wherein said cationic curable photoresist includes an epoxy polymer.

4. The method of claim 1 wherein said cationic curable photoresist includes an epoxy selected from the group of epoxidized novolak polymers, polyepoxides from epichlorohydrin and bisphenol A, and mixtures thereof.

5. The method of claim 1 wherein said cationic curable photoresist includes an octafunctional bisphenol A epoxy novolak.

6. The method of claim 1 wherein said film of cationic curable photoresist is provided on said substrate by laminating a dry film.

7. The method of claim 1 wherein said film of cationic curable photoresist contains:
   a. about 69% to about 79% by weight of an octafunctional bisphenol A epoxy novolak;
   b. about 15% to about 17% by weight of a difunctional cycloaliphatic epoxy;
   c. about 4% to about 6% by weight of a trifunctional epoxy;
   d. about 2.9% to about 6.9% by weight of a photoinitiator;
   e. 0% to about 0.15% by weight of a surfactant
   f. 0% to about 0.15% by weight of a fluorinated surfactant; the above amounts are based upon the total weight of the solids content of the photosensitive layer.

8. The method of claim 7 wherein b is represented by the fomula:

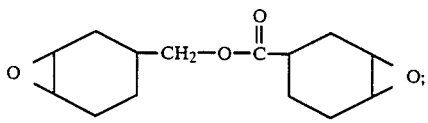

c is represented by the formula:

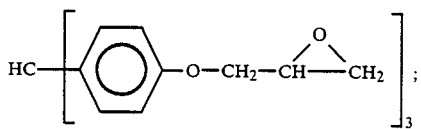

and d is represented by the formula:

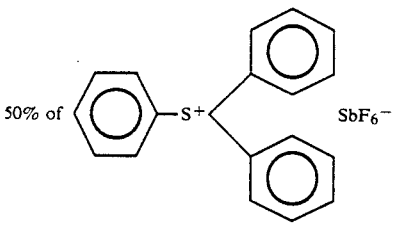

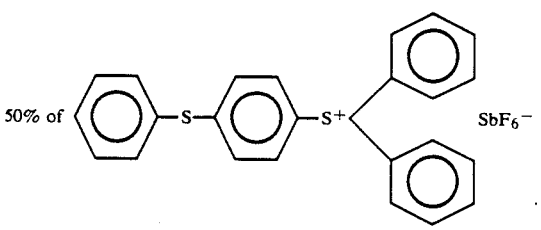

9. The method of claim 1 wherein said solvent is selected from the group of gamma-butyrolactone, propylene carbonate, diglyme or mixtures thereof.

10. The method of claim 1 wherein said solvent is selected from the group of mixtures of 1,1,1-trichloroethane with propylene carbonate or gamma-butyrolactone.

11. The method of claim 1 wherein said solvent includes gamma-butyrolactone.

12. The method of claim 4 wherein said solvent is selected from the group of gamma-butyrolactone, propylene carbonate, diglyme or mixtures thereof.

13. The method of claim 4 wherein said solvent is selected from the group of mixtures of 1,1,1-trichloroethane with propylene carbonate or gamma-butyrolactone.

14. The method claim 4 wherein said solvent includes gamma-butyrolactone.

* * * * *